United States Patent [19]

Matsuo et al.

[11] Patent Number: 5,316,962
[45] Date of Patent: May 31, 1994

[54] METHOD OF PRODUCING A SEMICONDUCTOR DEVICE HAVING TRENCH CAPACITORS AND VERTICAL SWITCHING TRANSISTORS

[75] Inventors: Naoto Matsuo, Ibaraki; Shozo Okada, Kobe; Michihiro Inoue, Ikoma, all of Japan

[73] Assignee: Matsushita Electric Industrial Co., Ltd., Kadoma, Japan

[21] Appl. No.: 926,847

[22] Filed: Aug. 6, 1992

Related U.S. Application Data

[60] Division of Ser. No. 731,420, Jul. 17, 1991, Pat. No. 5,181,089, which is a continuation-in-part of Ser. No. 565,049, Aug. 9, 1990, abandoned.

[30] Foreign Application Priority Data

Aug. 15, 1989 [JP] Japan .................................. 1-209646

[51] Int. Cl.$^5$ ...................... H01L 21/70; H01L 27/00
[52] U.S. Cl. ...................................... 437/52; 437/40; 437/48; 437/60; 437/919
[58] Field of Search ...................... 437/47, 52, 60, 919

[56] References Cited

U.S. PATENT DOCUMENTS

| | | | |
|---|---|---|---|
| 4,649,625 | 3/1987 | Lu .......................................... | 437/60 |
| 4,728,623 | 3/1988 | Lu et al. ................................... | 437/52 |
| 5,182,224 | 1/1993 | Kim et al. ................................ | 437/52 |

OTHER PUBLICATIONS

"Buried Storage Electrode (BSE) Cell for Megabit DRAMS" by M. Sakamoto et al. 29.5 1985 IEEE pp. 710–713.

Primary Examiner—Olik Chaudhuri
Assistant Examiner—H. Jey Tsai
Attorney, Agent, or Firm—Ratner & Prestia

[57] ABSTRACT

A semiconductor memory device is provided which includes a semiconductor substrate of a first conductivity type, a plurality of trench capacitors formed in the substrate and a plurality of switching transistors formed on the respective trench capacitors. Each of the switching transistors is electrically connected to the corresponding trench capacitor. Each of the trench capacitors has a first electrode formed in the side portion of a trench provided in the substrate and a second electrode containing impurities of the first conductivity type and embedded in the trench. Each of the switching transistors has a source region formed from a first epitaxial layer of the first conductivity type grown on the trench so as to electrically contact the second electrode, a channel region formed from a second epitaxial layer of a second conductivity type grown on the first epitaxial layer, and a drain region formed from a third epitaxial layer of the first conductivity type grown on the second epitaxial layer. The first, second and third epitaxial layers are in contact with a polycrystalline silicon layer containing impurities of the second conductivity type. The first conductivity type is opposite to the second conductivity type.

2 Claims, 7 Drawing Sheets

METHOD OF PRODUCING A SEMICONDUCTOR DEVICE HAVING TRENCH CAPACITORS AND VERTICAL SWITCHING TRANSISTORS

This application is a division of U.S. application Ser. No. 07/731,420, filed Jul. 17, 1991, now U.S. Pat. No. 5,181,089, which is a continuation-in-part of U.S. patent application Ser. No. 07/565,049, filed Aug. 9, 1990, now abandoned.

BACKGROUND OF THE INVENTION

1. Field of the invention

This invention relates to a semiconductor memory device, and more particularly, to a semiconductor memory device having numerous trench capacitors and switching transistors. This invention also relates to a method for producing the semiconductor memory device.

2. Description of the prior art

FIG. 4 shows the memory cell structure of a conventional semiconductor memory device such as a dynamic random access memory (DRAM).

This conventional semiconductor memory device includes a plurality of memory cells, each of which has a trench capacitor 40 formed in a P-type silicon substrate 32, and a switching transistor 41 connected to the trench capacitor 40.

The trench capacitor 40 has an N-type impurity diffused layer 33 whichis formed on the sides of a trench 42 provided in the silicon substrate 32, a capacitive oxide film 34 which is formed on the trench 42, and a cell plate 31 which is embedded in the trench 42.

The N-type impurity diffused layer 33 is connected to the source region 37 of the switching transistor 41. The drain region 38 of the switching transistor 41 is connected to a bit line 36. The bit line 36 is formed on an insulating film 39a which is deposited on the silicon substrate 32 so as to cover a gate electrode 35.

A plurality of other switching transistors 41 (not shown) are also connected to the same bit line 36.

An insulating film 39b is deposited over the insulating film 39a so as to cover the bit line 36.

The electrical connection between the source region 37 and the drain region 38 is opened and closed by controlling the potential level at the gate electrode 35 of the switching transistor 41.

Data is written into the capacitor 40, when the switching transistor 41 is in the on state, by causing a charge to flow from the bit line 36 into the N-type impurity diffused layer 33 of the capacitor 40 by way of the drain region 38, the surface of the silicon substrate 32 below the gate electrode 35, and the source region 37.

When the switching transistor 41 is in the off state, the charge remains held in the capacitor 40.

When the switching transistor 41 is turned to the on state, the charge stored in the N-type impurity diffused layer 33 of the capacitor 40 is caused to flow into the bit line 36 by way of the source region 37, the surface of the silicon substrate 32 below the gate electrode 35, and the drain region 38, thus reading the data stored in the capacitor 40.

In the conventional semiconductor memory device, the source region 37 and drain region 38 of the switching transistor 41 are formed in a self-aligning manner by implanting ions into the silicon substrate 32 with the gate electrode 35 as a mask (see, for example, M. Sahamoto et al., "Buried Storage Electrode (BSE) Cell For Megabit DRAMS", IEDM Dig of Tech: Papers (1985) P. 710).

The above-described technique, however, has the following problems.

For the purpose of achieving a higher degree of integration, it is required to reduce the size of the switching transistor 41 in a lateral direction. To reduce the size, the transistor must be shortened in a lateral direction. However, reducing the channel length of the switching transistor 41 would involve various problems such as a drop in the threshold voltage and a decrease in the dielectric strength between the source region 37 and the drain region 38.

To avoid such problems, it would become necessary to reduce the supply voltage for the semiconductor memory device, which in turn would cause problems, for example, in terms of compatibility with other semiconductor memory devices.

There has also been proposed a semiconductor memory device having a vertical transistor and a trench capacitor as shown in FIG. 5 (see Morimoto et al., Japanese Laid-Open Patent Publication No. 61-224351). In this memory device, the trench capacitor is formed in a P-type silicon substrate 41 and the vertical transistor is formed on the substrate 41. The vertical transistor includes source/drain regions (N-type layers) 42 and 43 positioned one above the other with a channel region (P-type silicon epitaxial layer) 39 interposed therebetween, and also includes a gate electrode (N-type silicon layer) 44 functioning as a word line. A gate insulating layer 50 is interposed between the gate electrode 44 and the source, channel and drain regions (42, 39 and 43). The trench capacitor includes a charge storage layer 45 made of an N-type silicon layer, a capacitor-insulating film 51, and a plate electrode 40 made of a P-type silicon buried layer.

The channel region 39 is electrically in contact with the plate electrode 10 which is electrically in contact with the P-type silicon substrate 41. Accordingly, the channel region 39 of the switching transistor is electrically connected to the P-type silicon substrate 41 through the plate electrode 40 of the trench capacitor. In this arrangement, a substrate bias is applied to the switching transistor through the route shown by arrow A in FIG. 5, and a plate bias is applied to the memory cell through the route shown by arrow B in FIG. 5. Thus, this conventional memory device involves a problem in that a substrate bias and a plate bias cannot be separately applied to the switching transistor and the memory cell, respectively.

SUMMARY OF THE INVENTION

The semiconductor memory device of this invention, which overcomes the above-discussed and numerous other disadvantages and deficiencies of the prior art, comprises a semiconductor substrate of a first conductivity type, a plurality of trench capacitors formed in the substrate and a plurality of switching transistors formed on the respective trench capacitors, each of the switching transistors being electrically connected to the corresponding trench capacitor, wherein the trench capacitor has a first electrode formed in the side portion of a trench provided in the substrate and a second electrode containing impurities of the first conductivity type and embedded in the trench, and wherein the switching transistor has a source region formed from a first epitaxial layer of the first conductivity type grown on the trench so as to electrically contact the second electrode, a channel region formed from a second epitaxial layer of a second conductivity type grown on the first epitaxial layer, and a drain region formed from a third epitaxial layer of the first conductivity type grown on the second epitaxial layer; the first, second and third epitaxial layers being in contact with a polycrystalline silicon layer containing impurities of the second conductivity type; the first conductivity type being opposite to the second conductivity type.

In a preferred embodiment, the polycrystalline silicon layer is in contact with a well of the second conductivity type formed in the semiconductor substrate.

The method for producing the semiconductor memory device of this invention, which overcomes the above-discussed and numerous other disadvantages and deficiencies of the prior art, comprises the steps of: forming a plurality of trenches in a semiconductor substrate of a first conductivity type; forming a capacitor insulating film on the side portion of each of the trenches; filling the trenches with electrically conductive materials containing impurities of the first conductivity type; covering the upper face of each of the electrically conductive materials embedded in the trenches with an insulating film having an opening therein; growing a first epitaxial layer of the first conductivity type on the insulating film by the lateral epitaxial growth technique, the first epitaxial layer acting as a source region of each of the switching transistors; growing a second epitaxial layer of a second conductivity type on the first epitaxial layer, the second conductivity type being opposite to the first conductivity type and the second epitaxial layer acting as a channel region of each of the switching transistors; growing a third epitaxial layer of the first conductivity type on the second epitaxial layer, the third epitaxial layer acting as a drain region of each of the switching transistors; and forming a polycrystalline silicon layer containing impurities of the second conductivity type on the semiconductor substrate, the polycrystalline silicon layer being in contact with the first, second and third epitaxial layers.

In a preferred embodiment, the aforementioned method further comprises the step of: forming a well of the second conductivity type in a surface portion of the semiconductor substrate which is in contact with the polycrystalline silicon layer.

Thus, the invention described herein makes possible the objectives of (1) providing a semiconductor memory device containing switching transistors having a horizontally reduced size without requiring a reduction in the supply voltage and suitable for achieving a high degree of integration; (2) providing a semiconductor memory device in which a substrate bias and a plate bias can be separately applied to the switching transistor and the memory cell, respectively; and (3) providing a method for producing a semiconductor memory device having such excellent advantages.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
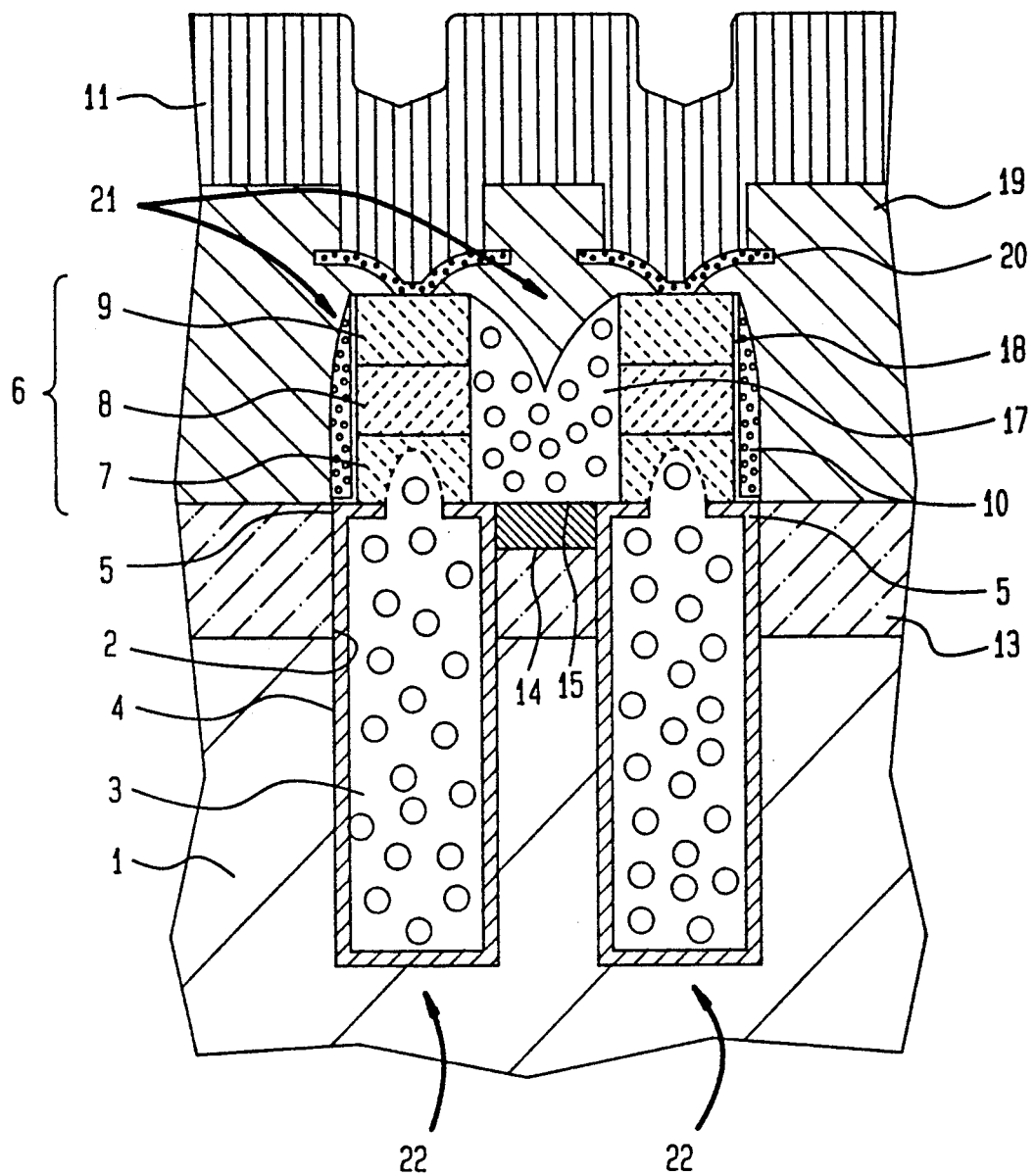
FIG. 1 is a sectional view showing two memory cells of a semiconductor memory device of this invention.

FIG. 1 shows a cross section of a main part of a semiconductor memory device of this invention. The semiconductor memory device includes numerous trench capacitors 22 and switching transistors 21 formed on the respective trench capacitors 22. Each of the switching transistors 21 is electrically connected to the corresponding trench capacitor 22.

The trench capacitors 22 each include a side portion (acting as a first electrode of the capacitor) of a trench 2 formed in an N-type single-crystal silicon substrate 1, a capacitor insulating film 4 formed on the side portion of the trench 2, and a storage node 3 (acting as a second electrode of the capacitor) embedded in the trench 2.

The switching transistors 21 are N-channel vertical MOS transistors, each comprising a source region which is formed from a first epitaxial layer 7 grown over the storage node 3, a channel region which is formed from a second epitaxial layer 8 (0.2 μm thick) grown on top of the first epitaxial layer 7, and a drain region which is formed from a third epitaxial layer 9 grown on top of the second epitaxial layer 8.

Between the second electrode 3 (i.e., storage node) and the first epitaxial layer 7 (i.e., source region of the switching transistor 21), there is disposed an insulating film 5 having an opening therein, through which the second electrode 3 is in electrical contact with the first epitaxial layer 7.

As described above, the switching transistor 21 used herein is an N-channel vertical transistor with an MOS structure 6 having the three epitaxial layers, which is disposed above the corresponding trench capacitor 22.

A gate electrode 10 is formed on one side of the multi-layered structure 6 which consists of the first, second, and third epitaxial layers 7, 8, and 9. Between the gate electrode 10 and the multi-layered structure 6, there is disposed a gate insulating film 18. A vertical MOS transistor is thus constructed.

A P-type well 13 is formed in the N-type silicon substrate 1, the P-type well 13 being electrically connected through a polycrystalline silicon film 17 to the multi-layered structure 6 which consists of the first, second, and third epitaxial layers 7, 8, and 9.

To reduce the contact resistance between the polycrystalline silicon film 17 and the P-type well 13, a P+-type diffused region 14 is disposed in the surface portion of the P-type well 13 in such a manner that the polycrystalline silicon film 17 is in contact with the P+-type diffused region 14.

The polycrystalline silicon film 17 acts as an electrode for applying a substrate bias to the switching transistor 21, i.e., for applying a potential to the P-type well 13. The polycrystalline silicon film 17 is in contact with the P+-type diffused region 14 formed within the P-type well 13. For example, a voltage of −2 V is applied as a substrate bias of the vertical MOS transistor through the polycrystalline silicon film 17 to the P-type well 13. While applying the voltage of −2 V to the P-type well 13, one half of the voltage Vcc of a power source can be applied as a capacitor plate bias to the N-type semiconductor substrate (i.e., 1.65 V is applied when the voltage Vcc of the power source is 3.3 V). Therefore, in the memory device of this invention, the substrate bias and the plate bias can be separately applied to the MOS transistor and the memory cell, thereby attaining their respective optimum potential levels.

The formation of the P-type well 13 and P+-type diffused region 14 is not essential to the memory device of this invention. In a memory device having neither the P-type well 13 nor the P+-type diffused region 14, a voltage is applied directly to the polycrystalline silicon layer 17 through the surface of the memory device as a substrate bias to the MOS transistor.

An insulating film 19 is deposited over the silicon substrate 1 so as to cover the switching transistor 21 and the polysilicon film 17, while a bit line 11 is formed on the insulating film 19.

The bit line 11 is in contact with the third epitaxial layer 9 (i.e., drain region) through a contact pad 20 provided on the third epitaxial layer 9. The contact pad 20 serves to provide stable contact characteristics.

According to the construction of this example, since the switching transistor 21 has a vertical MOS transistor structure, a reduction in the area of the substrate 1 taken by the switching transistor 21 can be achieved without reducing the channel length (i.e., thickness of the second epitaxial layer 8). This serves to resolve various problems involved in reducing the channel length.

The channel length employed in this example is 0.2 μm, but it is appreciated that even if the channel length is enlarged, it will not result in a decrease in the degree of DRAM integration.

Figure 2:
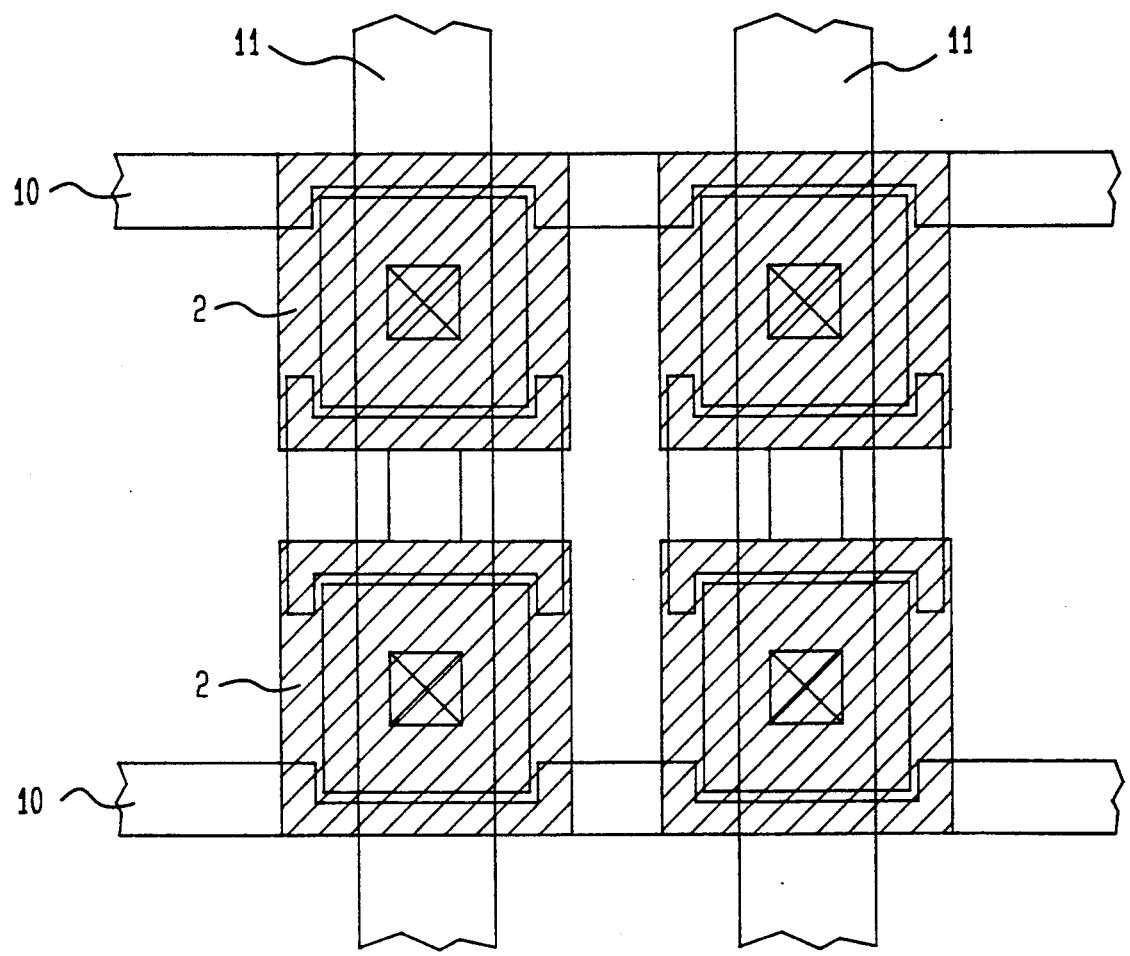
FIG. 2 is a plan view showing the layout of four memory cells of the semiconductor memory device of FIG. 1.

FIG. 2 is a plan view showing the layout of four memory cells of the semiconductor memory device of FIG. 1.

The trench 2 is disposed in each of the shaded square areas. In this figure, the multi-layered structure 6 of the vertical switching transistor 21 is disposed inside the area of the trench 2.

According to such a construction, the area of a memory cell is virtually determined by the area of the trench 2 on the layout (which corresponds to the bottom area of the trench 2). This saves the space used to form switching transistors in conventional semiconductor memory devices, and therefore serves to achieve a much higher degree of memory call integration.

Supposing the bottom area of the trench 2 is 0.6×0.6 μm² (0.36 μm²), the spacing from one trench to another is 0.2 μm, the chip area is 300 μm², and the memory array proportion is 63%, the degree of integration equivalent to 500 megabits can be obtained with the above construction.

When the depth of the trench 2 is 3 μm and the oxide film thickness of the gate electrode 10 is 5 nm, the capacitance of one trench capacitor 22 is 50 fF, which satisfies the value required in a semiconductor memory device.

Figure 5:
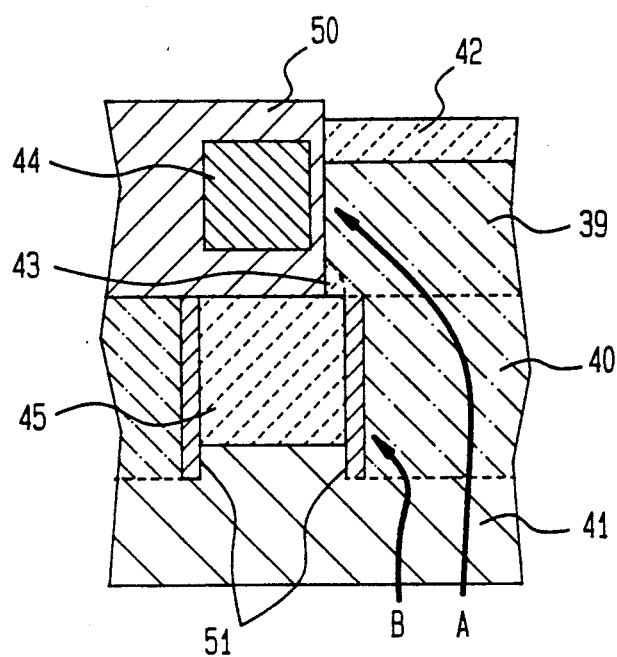
FIG. 5 is a sectional view showing another conventional semiconductor memory device.
Figure 6A:
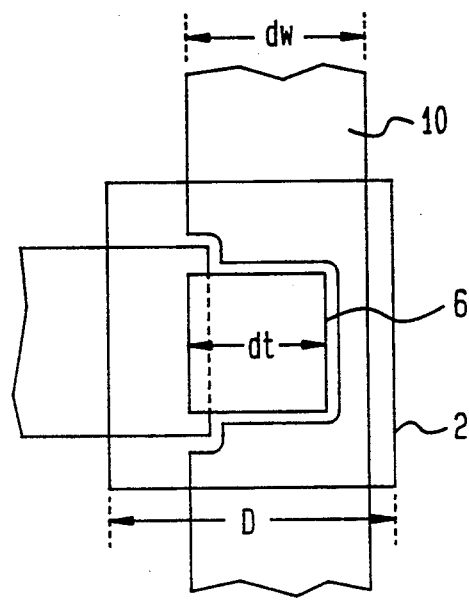
FIG. 6A is a plan view showing a memory cell portion of the semiconductor memory device of FIG. 1.
Figure 6B:
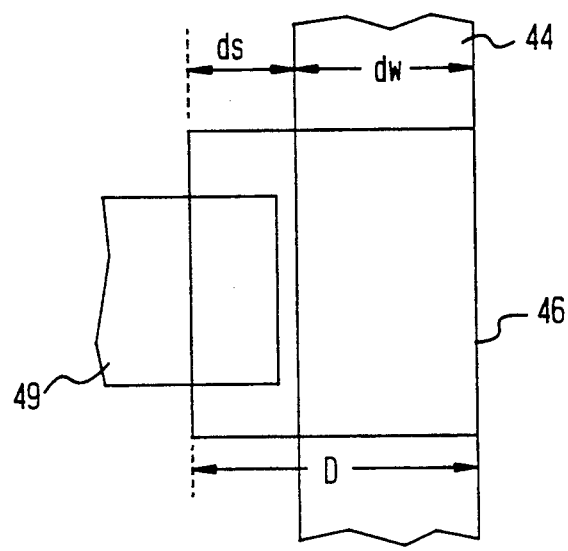
FIG. 6B is a plan view showing a memory cell portion of the conventional semiconductor memory device of FIG. 5.

The structure of the semiconductor memory device according to this invention can attain a high degree of integration, as compared with the conventional memory device shown in FIG. 5. FIGS. 6A and 6B are plan views of the memory device of this invention shown in FIG. 1 and the conventional memory device of FIG. 5, respectively.

In the memory device of this invention shown in FIG. 6A, the length D of each side of the trench 2 is determined by either the width dW of the word line (gate electrode) 10 or the length dt of each side of the multi-layered structure 6, according to the expression (1) below.

$$D > dW \text{ or } dt \tag{1}$$

On the other hand, in the conventional memory device shown in FIG. 6B, a selective epitaxial layer 49 including source, drain and channel regions is partly located over a trench 46. The length D of each side of the trench 46 is determined by the sum of the width dW of the word line (gate electrode) 44 and the width dS of a portion of the selective epitaxial layer 49 which is located over the trench 46, according to the expression (2) below.

$$D > dW + dS \tag{2}$$

Therefore, the length D determined by the expression (1) is smaller than that determined by the expression (2), so that a higher degree of integration can be attained in the memory device of this invention shown in FIG. 6A (FIG. 1), as compared with the conventional memory device shown in FIG. 6B (FIG. 5).

We will now describe a method for producing the semiconductor memory device of FIG. 1 with reference to FIGS. 3A to 3F.

First, a P-type well 13 is formed in a prescribed region in the N-type silicon substrate 1, and then, a highly doped P+-type diffused layer 14 is formed in a prescribed region in the P-type well 13. The P+-type diffused layer 14 is provided to reduce the contact resistance between the polycrystalline silicon film 17 described below and the P-type well 13. The concentration of impurities in the P-type well 13 is in the range of $10^{16}$ to $10^{17}$ cm$^{-3}$, and the concentration of impurities in the P+-type diffused region 14 is in the range of $10^{20}$ to $10^{21}$ cm$^{-3}$.

Next, a trench 2 of 3 μm depth is formed in the silicon substrate 1 using the RIE (reactive ion etching) process.

By oxidizing the sides and bottom of the trench 2, a capacitor insulating film 4 of the trench capacitor 22 is formed with a thickness of 5 nm on the sides and bottom of the trench 2. Thereafter, the inside of the trench 2 is filled with polycrystalline silicon which is a conductive material containing N-type impurities (see FIG. 3A).

The polycrystalline silicon thus embedded acts as a storage node 3 (i.e., second electrode) of the trench capacitor 22.

Next, an insulating film 5 is formed over the polycrystalline silicon filled into the trench 2. In this example, the insulating film 5 is formed using a local oxidation process in which the top surface of the polycrystalline silicon layer is selectively oxidized. This process is described hereinafter.

First, a protective oxide film of 10 nm thickness is formed over the entire surface of the silicon substrate 1, and then, a silicon nitride film is deposited on the surface of the protective oxide film. The silicon nitride film is then patterned leaving the silicon nitride film on other regions of the silicon substrate 1 than the region where the trench 2 is formed.

The top surface of the polycrystalline silicon (i.e., storage node 3) which is not covered by the silicon nitride film is selectively oxidized to form the insulating film 5 thereon.

After removing the silicon nitride film and the protective oxide film, a prescribed portion of the insulating film 5 is selectively removed to form an opening therethrough.

Figure 3A:
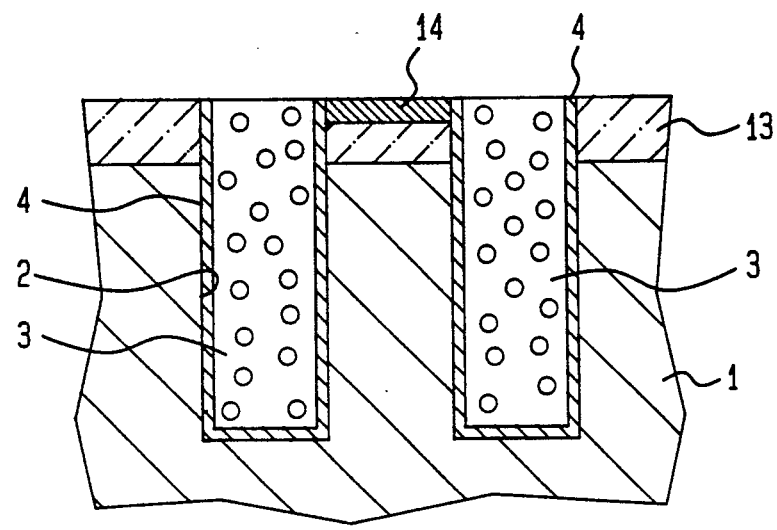
FIGS. 3A to 3F are sectional views showing the production of the semiconductor memory device of FIG. 1.
Figure 3B:
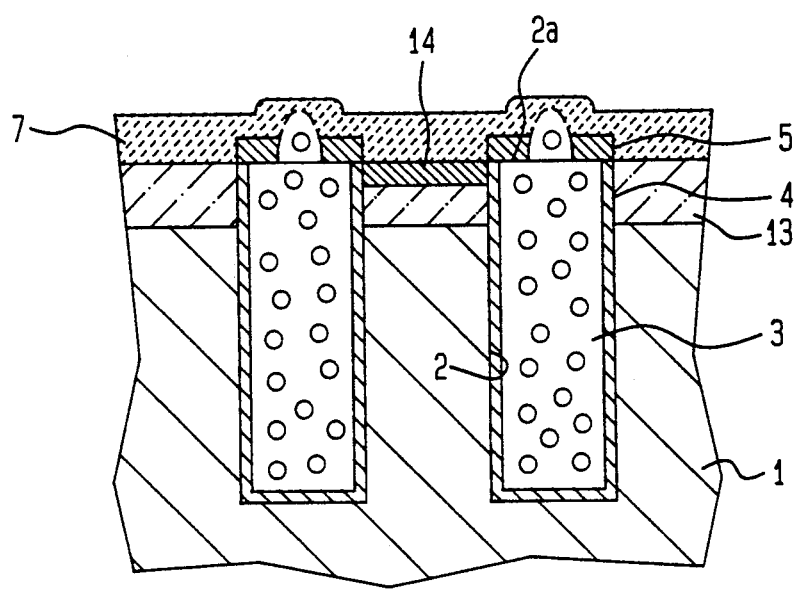

Next, using the lateral epitaxial growth technique, a first epitaxial layer 7 with a thickness of 0.2 μm is grown on the silicon substrate (see FIG. 3B).

Usually, epitaxial growth takes place vertically upward from the surface of the silicon substrate which is a single-crystal substance. Therefore, using a conventional epitaxial growth technique, it is not possible to form a single-crystal epitaxial layer over the insulating film. On the other hand, with the lateral epitaxial growth technique, since epitaxial growth takes place not only in the vertical upward direction but also in a lateral direction, the epitaxial layer which is grown from the exposed portion on the surface of the single-crystal substrate can be extended to cover the insulating film 5. It is thus possible to form a single-crystal epitaxial layer 7 covering the insulating film 5. However, in the portion of the first epitaxial layer 7 where it contacts the polycrystalline silicon in a trench 2 (through the opening in the insulating film 5), epitaxial growth does not occur, but a polycrystalline portion is formed.

A larger opening formed in the insulating film 5 provides a larger area for the polycrystalline portion in the first epitaxial layer 7, while a smaller opening provides a greater electrical resistance between the storage node 3 and the first epitaxial layer 7. Therefore, the proper size of the opening is determined according to the thickness of the first epitaxial layer 7.

In this example, since the switching transistor 21 is made in the form of an N-type MOS transistor, N-type impurities such as arsenic are used to form the first epitaxial layer 7.

Figure 3C:
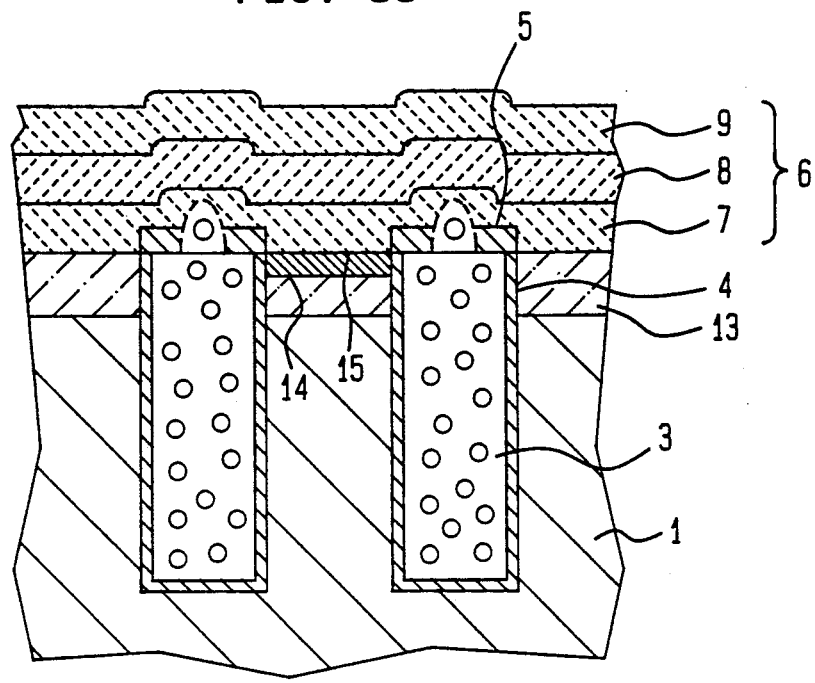
Figure 3D:
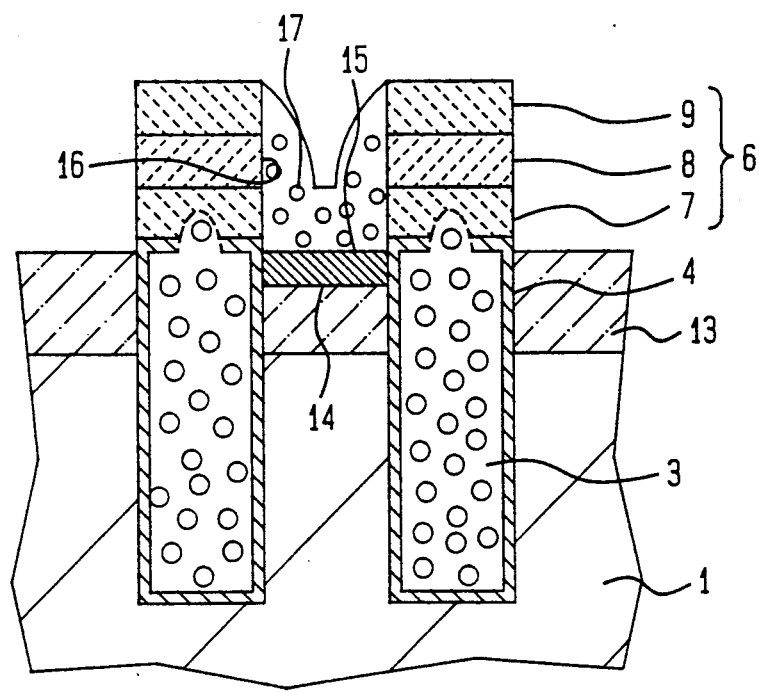

A second epitaxial layer 8 (0.2 μm thick) containing P-type impurities such as boron, and a third epitaxial layer 9 (0.2 μm thick) containing N-type impurities such as arsenic are successively formed on the first epitaxial layer 7 (see FIG. 3C).

The concentration of the N-type impurities in the first and third epitaxial layers is within the range of $10^{19}$ to $10^{20}$ cm$^{-3}$, and the concentration of the P-type impurities in the second epitaxial layer is $10^{16}$ cm$^{-3}$.

Using a conventional photolithography technique, the first, second, and third epitaxial layers 7, 8, and 9 are patterned so that the multi-layered structure 6 consisting of the epitaxial layers 7, 8, and 9 are formed only in the region where the vertical MOS transistor is to be formed.

After depositing a silicon nitride film on the silicon substrate 1 so as to cover the semiconductor substrate 1 and multi-layered structure 6, the silicon nitride film formed on a P-type well contact region 15 is selectively etched using a photographic mask to expose the surface of the P-type well contact region 15. In this process, the silicon nitride film formed on the side 16 of the multi-layered structure 6 is also selectively etched.

Thereafter, a P-type polycrystalline silicon layer (0.3 μm thick) is deposited on the substrate 1. The concentration of the P-type impurities in the polycrystalline silicon layer is in the range of $10^{19}$ to $10^{20}$ cm$^{-3}$.

Next, using a photographic mask which has the reversed pattern of and is larger than the photographic mask used for selectively etching the silicon nitride film, the P-type polycrystalline silicon layer formed on the third epitaxial layer 9 is selectively etched. As a result of the etching, the portions (of the P-type polycrystalline silicon layer) positioned on regions other than where the nitride film was removed are removed. Thus, the P-type polycrystalline silicon layer is left on the P-type well contact region 15, resulting in a P-type polycrystalline silicon 17 connecting between the P-type well contact region 15 and the multi-layered structure 6 (see FIG. 3D). Thereafter, the remaining silicon nitride film is removed.

The above etching of the P-type polycrystalline silicon layer is stopped at the point where the etching of the nitride film begins. In other words, the endpoint of the above etching is determined by detecting the presence of the nitride film. This prevents excessive etching, and therefore, no etching damage is caused to the multi-layered structure 6.

Figure 3E:
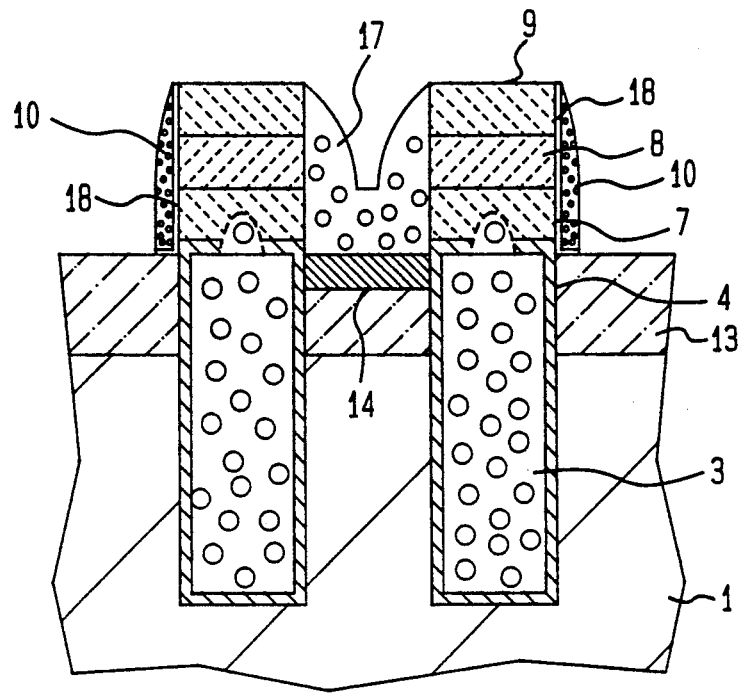

Then, an SiO$_2$ film having a thickness of 10 nm is formed on the substrate 1, P-type polycrystalline silicon layer 17 and multi-layered structure 6. A polycrystalline silicon film is deposited on the entire surface of the SiO$_2$ film, while introducing phosphorus (P) in situ at a concentration of $10^{19}$ to $10^{20}$ cm$^{-3}$. Then, the prescribed portions of the SiO$_2$ film and polycrystalline silicon film are removed by reactive ion etching, resulting in a gate oxide film 18 and a gate electrode (word line) 10, respectively, as shown in FIG. 3E.

Thereafter, an interlayer insulating film 19 consisting of a borophosphosilicate glass (EPSG) film is formed on the substrate.

Figure 3F:
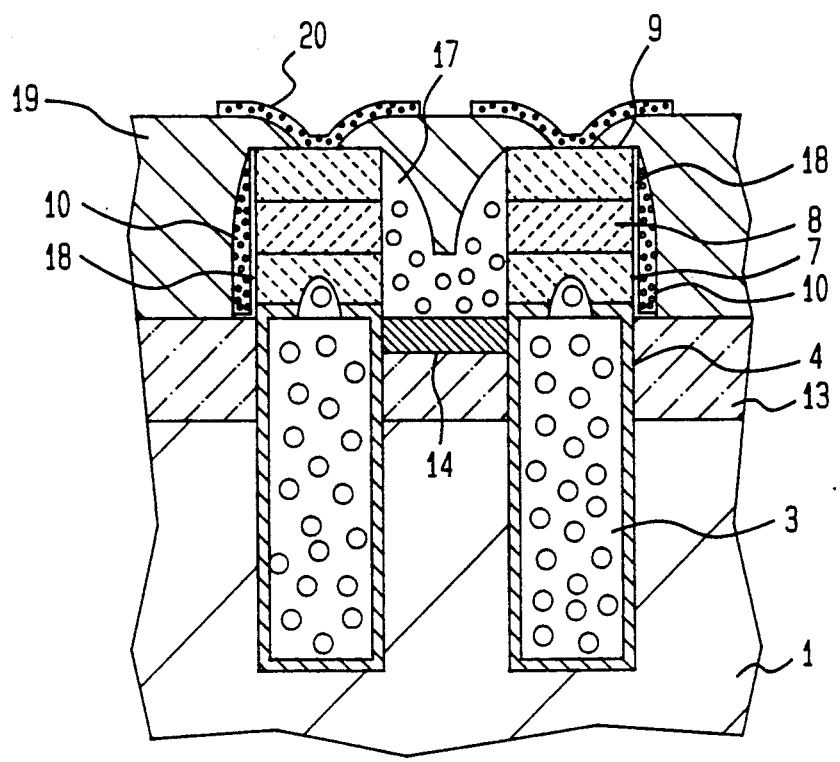
Figure 4:
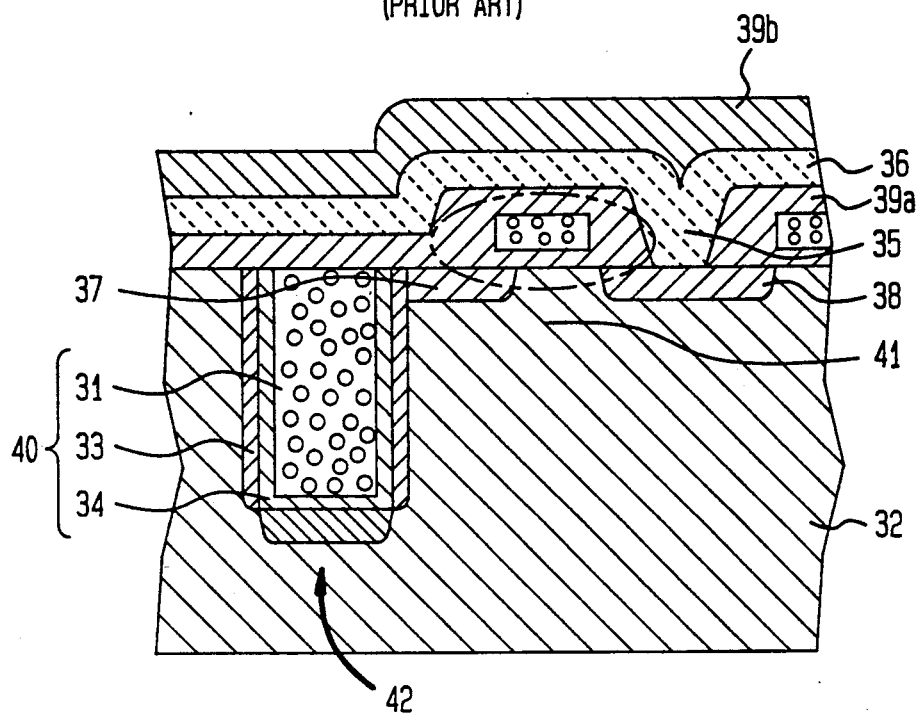
FIG. 4 is a sectional view showing one memory cell of a conventional semiconductor memory device.

After making a contact hole in the interlayer insulating film 19 for connecting the bit line 11 to the third epitaxial layer 9, a contact pad 20 formed from polycrystalline silicon is formed on a prescribed region of the interlayer insulating film 19 so as to contact the third epitaxial layer 9 (see FIG. 3F).

Thereafter, the bit line 11 made of aluminum or other material is formed to complete the production of the semiconductor memory device of FIG. 1.

According to the construction of this example, the area of a memory cell is virtually determined by the area of the trench on the layout (which corresponds to the bottom area of the trench). This saves the space used to form switching transistors in conventional semiconductor memory devices, and therefore serves to achieve a much higher degree of memory cell integration.

Also, in this example, since the N-type silicon substrate 1 is used as a cell plate, it serves to prevent the charge stored in the trench capacitor from leaking to the adjacent trench capacitors even if the trenches are disposed close to each other. This allows a design in which the trenches are disposed as close to each other as the lithography resolution limit can permit.

Furthermore, according to the invention, a polycrystalline silicon layer containing impurities of the opposite conductivity type to that of the substrate of the memory device is formed in contact with the source, channel and drain regions of the MOS transistor. This makes it possible to apply a substrate bias to the MOS transistor through the polycrystalline silicon layer. Therefore, the memory device of this invention is advantageous in that a substrate bias and a plate bias can be separately applied with their respective optimum potential levels to the MOS transistor and the memory cell, respectively.

The semiconductor memory device of this example has N-channel vertical MOS transistors formed on an N-type silicon substrate, but the same effects as described in connection with this example can also be expected from a semiconductor memory device having P-channel vertical MOS transistors formed on a P-type silicon substrate. In either case, the conductivity type of the well 13, diffused region 14 and polycrystalline silicon layer 17 is required to be opposite to that of the semiconductor substrate 1.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A method for producing a semiconductor memory device having a plurality of trench capacitors and a plurality of switching transistors electrically connected to said trench capacitors, comprising the steps of: forming a plurality of trenches in a semiconductor substrate of a first conductivity type; forming a capacitor insulating film on the side portion of each of said trenches; filling said trenches with electrically conductive materials containing impurities of the first conductivity type; covering the upper face of each of said electrically conductive materials embedded in the trenches with an insulating film having an opening therein; growing a first epitaxial layer of the first conductivity type on said insulating film by the lateral epitaxial growth technique, said first epitaxial layer acting as a source region of each of said switching transistors; growing a second epitaxial layer of a second conductivity type on said first epitaxial layer, said second conductivity type being opposite to the first conductivity type and said second epitaxial layer acting as a channel region of each of said switching transistors; growing a third epitaxial layer of the first conductivity type on said second epitaxial layer, said third epitaxial layer acting as a drain region of each of said switching transistors; and forming a polycrystalline silicon layer containing impurities of the second conductivity type on said semiconductor substrate, the polycrystalline silicon layer being in contact with said first, second and third epitaxial layers.

2. A method according to claim 1, further comprising the step of: forming a well of the second conductivity type in a surface portion of said semiconductor substrate which is in contact with said polycrystalline silicon layer.

* * * * *